United States Patent [19]

Matherly et al.

[11] Patent Number: 4,463,399
[45] Date of Patent: Jul. 31, 1984

[54] CIRCUIT FOR INTRINSICALLY SAFE PILOT LIGHT

[75] Inventors: David R. Matherly, West Asheville; Horace O. Sue, Asheville, both of N.C.

[73] Assignee: Square D Company, Palatine, Ill.

[21] Appl. No.: 399,565

[22] Filed: Jul. 19, 1982

[51] Int. Cl.³ .............................................. H02H 7/00
[52] U.S. Cl. ..................................... 361/1; 340/815.14
[58] Field of Search ....................... 361/1, 142; 357/75; 340/815.14, 815.15, 815.03

[56] References Cited

U.S. PATENT DOCUMENTS 4,298,869 11/1981 Okuno ......................... 340/815.03 X

OTHER PUBLICATIONS

Elektor, PSUS on PCBS, "Building Power Supplies the Easy Way", Mar., 1979, vol. 5, No. 3, pp. 3–36.

*Primary Examiner*—William M. Shoop
*Attorney, Agent, or Firm*—William H. Schmeling; Richard T. Guttman

[57] ABSTRACT

An electric circuit for energizing an intrinsically safe pilot light having a cluster of light emitting diodes arranged in a pattern and visible through a lense cap located in a hazardous area. The pilot light has terminals connected through the circuit that includes a rectifying bridge and a current regulator to the diodes to optimize the light output of the diodes and make the pilot light insensitive to the polarity of an A.C. or D.C. intrinsically safe electrical supply to the pilot light and limiting the current to the diodes to a constant value in event one or more of the diodes is destroyed or shorted. A pair of printed circuit boards are spaced by a plurality of conductive supports with one of the boards mounted on a base of the pilot light and carrying the rectifier and current limiting components which are connected to the terminals. The other printed circuit board provides a support for the diodes and has a printed circuit thereon, portions of which provide a reflective surface for light emitted by the diodes. The pilot light includes a translucent lense cap formed of material that transmits light frequencies matching the light frequencies emitted by the light emitting diodes and optionally may include a fuse that replaces one of the conductive supports and limits current to the hazardous area.

9 Claims, 4 Drawing Figures

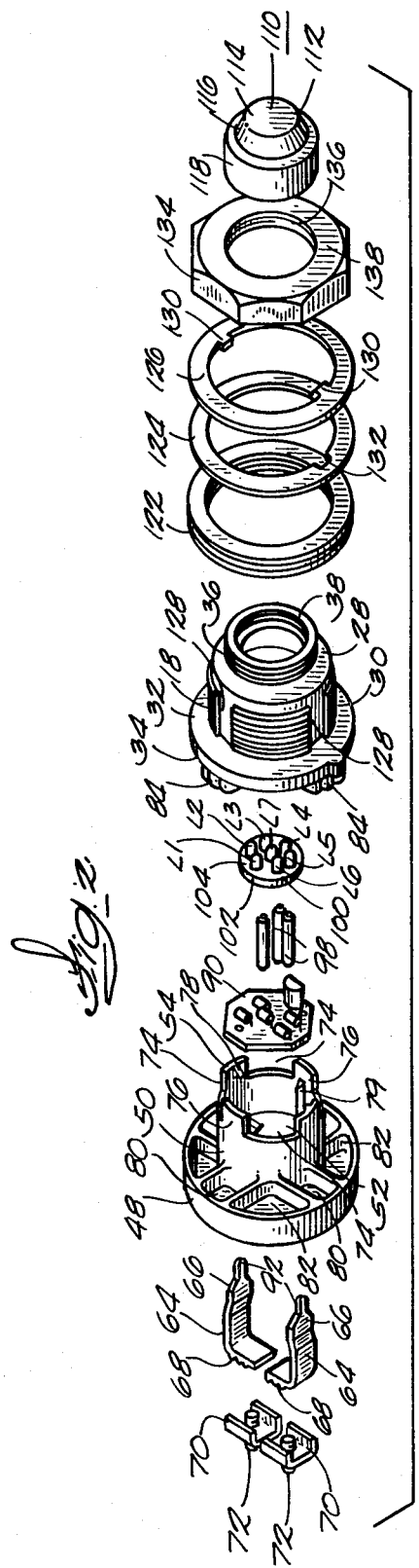
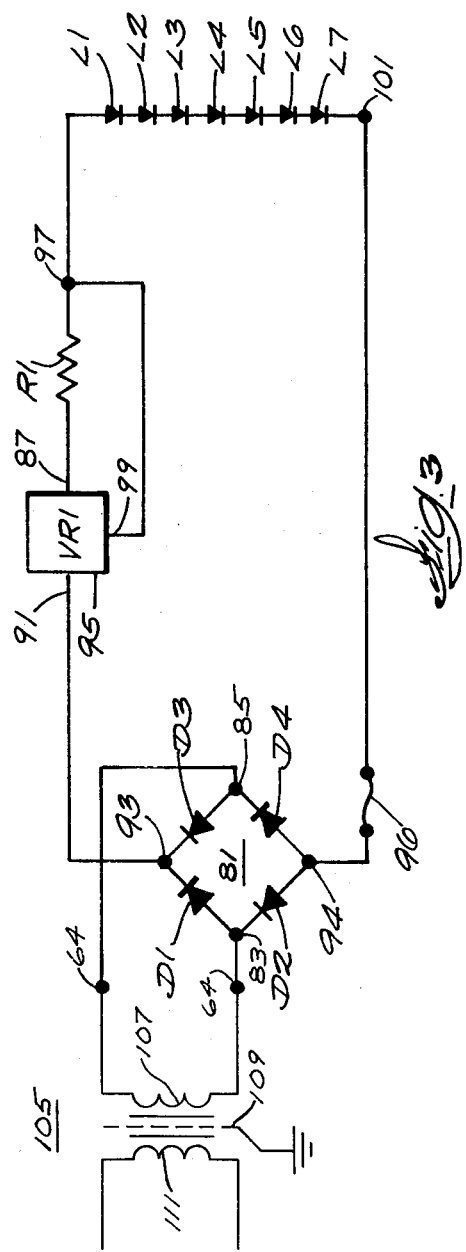

CIRCUIT FOR INTRINSICALLY SAFE PILOT LIGHT

BACKGROUND OF THE INVENTION

The present invention relates to status indicating illuminative devices and more particularly to an energizing circuit for a pilot light that is designed to be considered as intrinsically safe so it may be mounted in areas considered hazardous.

The requirements of intrinsically safe devices and wiring of such devices generally are expressed in the National Electric Code as follows:

Equipment and associated wiring approved as intrinsically safe may be installed in any hazardous location for which it is approved and the provisions pertaining to conventional explosion proof procedures need not apply to such installation. Intrinsically safe equipment and wiring is incapable of releasing sufficient electrical energy under normal or abnormal conditions to cause ignition of a specific hazardous atmospheric mixture. Abnormal conditions will include accidental damage to any part of the equipment or wiring, installation or other failure of electrical components, application of over-voltage, adjustment and maintenance operations and other similar conditions.

SUMMARY OF THE INVENTION

It is an object of the present invention to provide a circuit for a pilot light that has a plurality of solid state light emitting components so the pilot light and its associated wiring as may be considered as an intrinsically safe device.

A further object is to provide an energizing circuit for an intrinsically safe pilot light that has a base positionable in an opening in a wall or a panel that is located in a hazardous area. The pilot light energizing circuit includes a cluster of light emitting diodes that are positioned by the base to be visible in the hazardous area. The pilot light also includes a current regulator connected between the diodes and terminals positioned by the base to limit current to the diodes when any of the diodes are shorted or destroyed.

An additional object is to provide an energizing circuit for an intrinsically safe pilot light that has a base extending through an opening in a wall or a panel. The pilot light is provided with a cluster of light emitting diodes positioned by the base to be visible in a hazardous area. The diodes are covered by a lense formed of translucent material that is selected to transmit light having a frequency matching the frequency of the light emitted by the diodes. The circuit for the pilot light includes a full wave bridge rectifier and a current regulator so that the pilot light is polarity insensitive when the pilot light is connected to a DC supply and the current to the diodes remains constant when any of the diodes are shorted or destroyed.

Another object is to provide an energizing circuit for an intrinsically safe pilot light that has a base extending through an opening in a wall or a panel. The panel is located in a hazardous area and the pilot light is provided with a cluster of light emitting diodes positioned at one end of the base so as to be visible in the hazardous area and terminals positioned at the other end of the base. The diodes are covered by a lense formed of translucent material that is selected to transmit light having a frequency matching the frequency of the light emitted by the diodes. The pilot light circuit includes a rectifier and a current regulator so that the pilot light is polarity insensitive and will not be damaged when the pilot light is connected to an intrinsically safe DC supply. The current to the diodes from the intrinsically safe supply is maintained at a level which will not damage the individual diodes when any of the diodes are shorted or destroyed. Additionally, the pilot light includes a pair of printed circuit boards one of which is mounted on the base and carries a printed circuit connected to the terminals, the rectifier and the current regulator. The other printed circuit board is connected and spaced from the printed circuit on the base mounted board by a plurality of conductive supports with the printed circuit on the other circuit board electrically connected to the diode cluster and providing a reflective surface for light emitted by the diodes.

A further object is to provide an energizing circuit for an intrinsically safe pilot light. The pilot light includes a base that extends through an opening in a wall or a panel located in an environment designated as a hazardous area. The pilot light is provided with a cluster of light emitting diodes positioned by the base to be visible from one side of the panel and terminals positioned by the base to be accessible from the other side of the panel. The diodes are covered by a lense formed of translucent material that is selected to transmit light having a frequency matching the frequency of the light emitted by the diodes. The pilot light circuit has a rectifier and a current regulator connected so the pilot light is insensitive to the polarity of an intrinsically safe electric supply that is connected to the terminals and the current to the diode cluster is limited to a value which will not damage the individual diodes when any of the diodes are shorted or destroyed. Additionally, the pilot light includes a pair of printed circuit boards one of which is mounted on the base and carries a printed circuit connected to the terminals, the rectifier and the current regulator. The other printed circuit board is connected and spaced from the printed circuit on the base mounted board by a plurality of conductive supports with the printed circuit on the other circuit board electrically connected to the diode cluster and providing a reflective surface for light emitted by the diodes. Optionally, the pilot light may include a fuse that is substituted for one of the conductive supports.

Further objects and features of the invention will be readily apparent to those skilled in the art from the specification and the appended drawing illustrating a preferred embodiment in which an intrinsically safe pilot light incorporating the features of the present invention is diagrammatically shown.

In the drawings,

FIG. 2 is an exploded view showing in perspective the components of the pilot light assembly shown in FIG. 1, FIG. 3 is a schematic diagram of a circuit according to the present invention.

Figure 1:
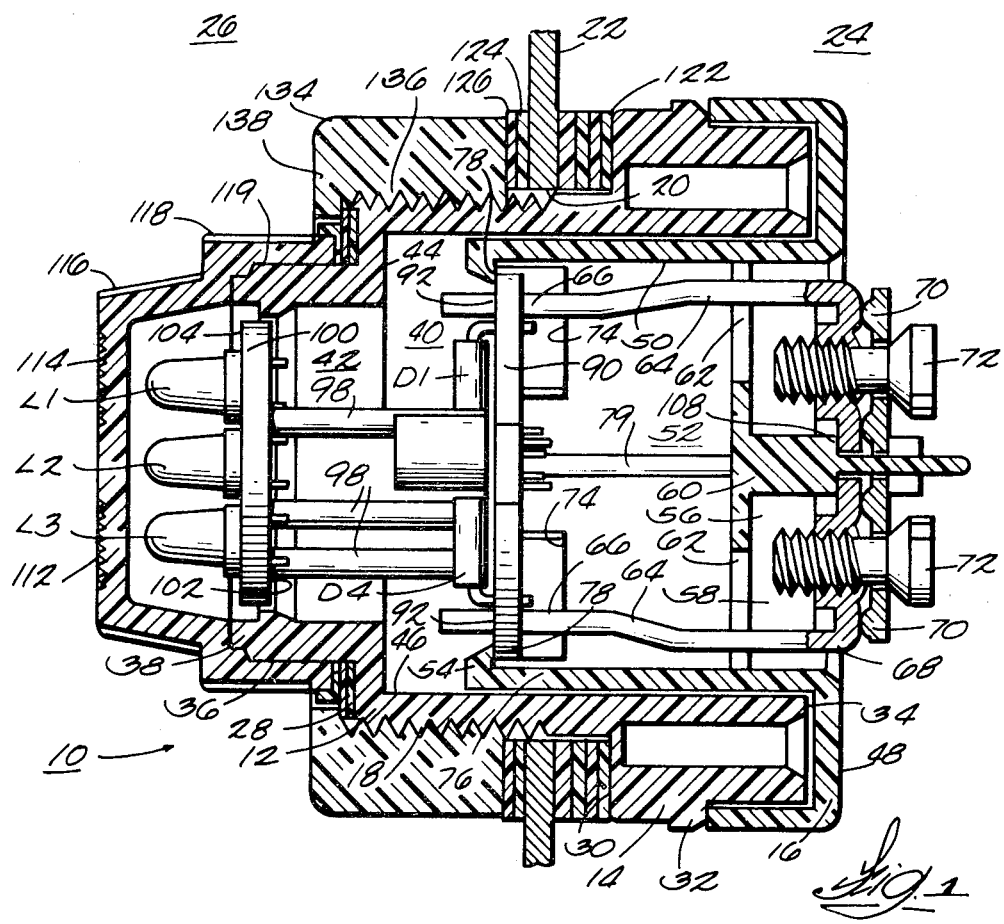
FIG. 1 is a cross section view of an intrinsically safe pilot light assembly incorporating an energizing circuit according to the present invention.

An intrinsically safe pilot light 10, as shown in the drawings, includes an insulating base 12 that is formed by a pair of mating base parts 14 and 16. The part 14 is provided with an outer cylindrical threaded portion 18 that is received in a suitable opening 20 in a wall or panel 22. The panel 22 is located in an environment that is considered as hazardous as defined by the National Electric Code.

The part 14 includes the threaded portion 18 that extends rearwardly from a forwardly facing annular surface 28 to a forwardly facing annular surface 30. The annular surface 30 is provided by an annular flange 32 that extends from the threaded portion 18 to a rear end 34 of the base part 14. A threaded portion 36 extends forwardly from the surface 28 to a front end 38. The threaded portion 36 has a smaller diameter than the portion 18 and thereby provides the surface 28. The base part 14 has a cylindrical bore 40 extending from the front end 38 to the rear end 34. The bore 40 has a portion 42 extending from the front end 38 to a rearwardly facing annular shoulder 44. The shoulder 44 extends between the bore portion 42 and a bore portion 46 that has a diameter larger than bore 42. The bore portion 46 extends from the shoulder 44 to the rear end 34.

The base part 16 is formed as a unitary molded part to have a cylindrical rear end portion 48 and a cylindrical portion 50 extending forwardly of the rear end portion 48. The diameter of the cylindrical portion 50 is less than the diameter of the rear end portion 48. The cylindrical portion 50 has a cylindrical socket 52 extending from a front end 54 of the base part 16 to a dividing wall 56. The dividing wall 56 separates the cylindrical socket 52 from a socket 58 that is cylindrical in shape and extends forwardly in the rear end portion 48. A barrier wall 60 bisects the socket 58. The dividing wall 56 is provided with a pair of openings 62 that extend through the dividing wall 56 and are spaced equidistantly on opposite sides of the barrier wall 60. The openings 62 provide a passage for a pair of terminals 64 having a printed circuit board mounting portions 66 extending through the openings 62 and wire connecting portions 68. Wire clamps 70 positioned by screws 72, are provided to secure wires from a source, as shown in FIG. 3, to the terminals 64. In the embodiment shown, the barrier wall 60 extends rearwardly of the rear end portion 48 to provide additional electrical clearances between the adjacent wire connecting portions 68. In a preferred embodiment, the front end 54 includes four spaced notches 74 defining four spaced projections 76. Two of the projections 76 at opposite sides of the socket 58 are provided with an overhanging lip 78 at their free ends which face inwardly in the socket 58. The remaining two projections 76 at opposite sides of the socket are provided with ribs 79 having ends spaced rearwardly of the free ends of the projections 76. As illustrated, the rear end portion 48 has four rectangular sockets 80 and triangular sockets 82, included therein to reduce the amount of molding material used in the part 16 with the rectangular sockets 80 providing the required space to receive four rearwardly extending abutments 84 extending from the rear end 34.

Figure 4:
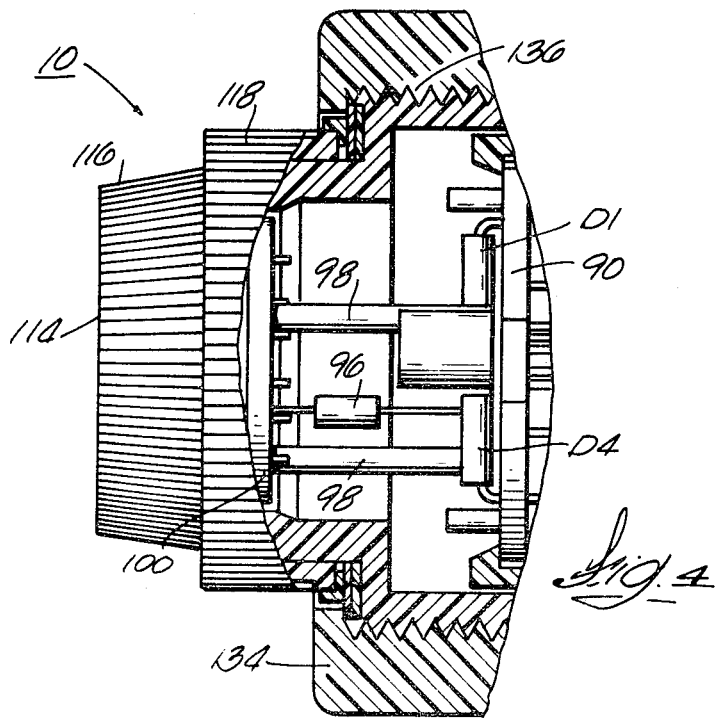
FIG. 4 illustrates the manner in which a fuse may be included in the assembly shown in FIG. 1.

The base part 16 provides a support for a pair of printed circuit boards 90 and 100 that are electrically interconnected and provide support for the electronic components included in the circuit as shown in FIG. 3. The printed circuit board 90 has a pair of openings receiving projecting ends 92 on terminals 64 with the printed circuit on the board 90 soldered to the projections 92 to complete the electrical circuit between the circuits on the board 90 and the terminals 64. The terminals 64 are connected to an intrinsically safe A.C or D.C. current source which may be of the type shown in U.S. Pat. No. 3,445,679, which was filed by Charles F. Meyer et al on Dec. 15, 1966. The circuit as shown in FIG. 3 includes diodes D1-D4 which are connected as full wave bridge rectifier to the terminals 64 to provide a DC potential across a pair of terminals 93 and 94 making terminal 93 positive in polarity. The terminal 93 is connected as an input to an encapsulated regulating circuit 95. The output of the regulating circuit 95 is connected as an input to seven series connected light emitting diodes, L1-L7, which in turn are connected through a fuse 96 to the terminal 94. As shown in FIGS. 1 and 2 of the drawings, when a fuse 96 is eliminated from the pilot light assembly, the terminals 93 and 94 are connected to the printed circuit on the printed circuit boards 90 and 100 by three conductive supports 98. As illustrated by FIG. 4 when a fuse is included in the pilot light assembly, a selected one of the conductive supports 98 normally connected between the boards 90 and 100 is replaced by the fuse 96.

The diodes L1-L7, which preferably are identical, are positioned on a front surface 104 of printed circuit board 100. The diodes L1-L7 are interconnected by printed circuits that are carried on rear and front surfaces 102 and 104 respectively of the printed circuit board 100. The front surface 104 of the board 100 includes a printed circuit which is connected where required to the diodes L1-L7. When the diodes L1-L7 are illuminated, portions of the printed circuit on the front surface 104 act as a reflector for light emitted by the diodes L1-L7.

The components of the base part 16 are assembled by interconnecting the printed circuit boards 90 and 100 with the three conductive support 98. The supports 98 are soldered to the printed circuits on board 90 and 100. Only two of the three conductive supports 98 are electrically connected between printed circuits on the boards 90 and 100. The third conductive support 98 merely adds mechanical strength to the connection between the boards 90 and 100. The terminals 64 with the wire clamps 70 and screws 72 assembled therewith, are inserted through the openings 62 to position the projecting ends 92 within the cylindrical socket 52 and the wire connecting portion 64 in the socket 58. The printed circuit board 90, which is assembled to the board 100 by the conductive supports 98, is positioned within the cylindrical socket 52. When the board 90 is in position in the socket 52, the pair of overhanging lips 78 on two of the four projections 76 will engage the front surface of the board 90 to prevent forward movement of the board 90 in the socket 52. When the board 90 is thus positioned, the rear surface of the board 90 will engage the front ends of ribs 79 formed along the inner surface of the two remaining projections 76 thereby preventing rearward movement of the board 90 in the socket 52. If a protective fuse 96 is included in the device 10, the base part 16 is modified by substituting a fuse 96 for one of the electrical supports 98 in a manner shown in FIG. 4.

The assembled base part 16 is then combined with the base part 14 by inserting portions of the part 16 into the bore 40 from the rear end 34 of the base part 14. When the part 16 is assembled with the part 14, the printed circuit board 100 will be positioned at the front end 38 of the bore 42 so the light emitting diodes L1-L7 are visible from the front end of the pilot light 10. When parts 14 and 16 are assembled, wire clamping portions 68 of the terminals 64 will engage abutments 108 on the barrier wall 60 to prevent forward movement of the terminals 64. When the parts are thus assembled, the rear end portion 48 of the part 16 will engage the rear end 34 of the part 14.

The pilot light 10 includes a lense 110 that is formed of translucent material that transmits light having a wave frequency matching the frequency of the output illumination of the diodes L1-L7. Thus if the illumination output of the diodes L1-L7 is selected to have a red color output, the lense 110 material will be selected to transmit colors in the red frequency range and act as a filter for the remaining color spectrum. Obviously, if the light output of the diodes is yellow, a yellow or amber colored lense will be used. For green, the same matching characteristics between the diodes and lense is used. To maximize the visibility of the lense 110, the lense 110 is formed as a truncated cone with a flat front surface 112 including a pattern formed by having concentric circles 114. The lense is also formed with serrations 116 along its tapered side wall and along a periphery of a cylindrical skirt portion 118. The lense is provided with internal threads 119 to threadedly receive the threads 36. In the embodiment shown, the lense is provided with an internal annular surface that abutts the front end 38 when the lense 110 is threaded upon the threads 36.

It is well known that the illuminating output of light emitting diodes is relatively modest. Thus, when light emitting diodes are used in a pilot light, the lumen output of the light emitting diodes must be maximized. In the present invention this is accomplished by arranging the light emitting diodes L1-L7 in a pattern as shown in FIG. 2 which consists of locating one of the diodes L1-L7 in the center of a pattern on the printed circuit board 100 and locating the remaining six light diodes at a minimum distance equidistantly at 60 degree arc intervals from the central diode. To further enhance the light output of the pilot light 10, the material of the lense 100 is selected to transmit light frequencies matching the light output frequency of the diodes L1-L7. The pilot light 10 is designed to be positioned in an opening in a panel in an area considered as hazardous. When the threaded portion 18 of the pilot light 10 is positioned in the opening 20 in the panel 22, one or more elastomeric annular seals or washers 122 surrounding the portion 18 will be positioned between the annular surface 30 and the rear surface of the panel 22 to form a seal between a pilot light 10 and the panel 22. When the pilot light 10 is thus positioned in the opening in the panel 22, a legend plate or a spacer ring 124 and a retaining ring 126 are positioned on the threaded portion 18 at the front side of the panel 22. In the embodiment shown, the threaded portion 18 is provided with a plurality of radially spaced keyways 128 that receive indexing lugs 130 on the inner periphery of the retaining ring 126. The indexing lugs 130 have portions extending through notches 132 in the spacer ring 124 and into a suitably located notch, not shown in panel 22, to prevent the rotation of the legend plate or spacer ring 124 and pilot light 10 in the opening 20. A nut 134 is used to secure the pilot light 10 in the opening 20. The nut 134 has threads 136 which are rotated on the threaded portion 18 so the nut 134 engages the retaining ring 126 and thereby compresses the washers 122 against the rear surface of the panel 22. The nut 134 has an inwardly extending flange 138 at its front end which overlays the forwardly facing surface 28 and receives the annular skirt 118. After the base part 14, the base part 16 and the lense 110 are assembled as described, clear epoxy material, which is well known and readily available, is introduced to fill the area bounded by the front surface 104 of the printed circuit board 100 and the inner surface of the lense 110. When the epoxy material is thus introduced, the diodes L1-L7 are completely embedded in the epoxy material. The epoxy material also migrates into the space between the threads 36 and 119 to completely seal the lense 110 to the base 12. The epoxy material is preferably selected to have a refraction index approximately equal to the refraction index of the molded plastic material forming the lense 110. After the light emitting diodes L1-L7 have been encapsulated, the remainder of the bore 40 may be filled with the same epoxy material that embeds the diodes or a encapsulating material having a higher heat conducting capability. While not shown, the epoxy material as described is injected through aligned holes present in the barrier wall 60, the printed circuit board 90 and the printed circuit board 100.

The circuit as shown in FIG. 3 includes diodes D1-D4 that are connected and poled to form a full wave bridge rectifier 81. The rectifier 81 has input terminals 83 and 85 connected through the terminals 64 of the pilot light 10 to a A.C. or D.C. electric source, not shown, that is considered as intrinsically safe, i.e. a source that under normal or abnormal conditions does not release sufficient energy to ignite a specific ignitable atmospheric mixture. The rectifier 81 has the pair of output terminals 93 and 94 and its diodes D1-D4 polarized so that the terminal 93 is positive in polarity relative to the terminals 94 regardless of the polarity of the connection to the terminals 83 and 85 to the electric source. The output terminal 93 is connected to an input terminal 91 of a constant current regulator 95 that includes resistor R1. The regulator 95 preferably is a well known three terminal fixed-voltage monolithic integrated circuit type voltage regulator which has its output 87 connected through the resistor R1 to a terminal 97 to provide a regulated current at terminal 97. The terminal 97 is connected to the control input 99 of the regulator 95 and provides the input terminal for the diodes L1-L7. In the preferred embodiment, seven diodes L1-L7 are connected in series between the terminal 97 and a terminal 101 which in turn is connected through a fuse 96, when present, to the terminal 94.

The diodes L1-L7 number seven, as seven is the maximum number of equal diameter circular diodes that can be clustered in a minimum diameter circular pattern. The current regulation provided by the regulator 95 and the resistor R1 permits the light emitting diodes to operate at optimum brightness over the entire range of voltage excursions across the pilot light. A voltage excursion may occur when the diodes fail in a shorted condition which is the normal failure mode of diodes. The diode cluster affords advantages over incandescent lamps normally employed in pilot lights. As well known, incandescent lamps are fragile and generate heat when illuminated. When diodes are employed and are encapsulated in epoxy, a relatively indestructable package results. Further, as diodes usually fail in a shorted or conducting mode, failure of one or more of the diodes will merely result in a corresponding diminution of the light output of the cluster of diodes without an increase in current in the remaining operative diodes. This is in marked contrast to pilot lights using incandescent lamps. Incandescent lamps normally are not encapsulated because the dissipation of heat generated by the lamps is reduced by the encapsulating material and the therefore would result in a premature failure of the incandescent lamp.

As stated above the lense material and the encapsulating material are preferably selected to have similar refractive indexes and the illuminating output of the light emitting diodes is relatively modest. The light output of the diodes is maximized by providing the serations and concentric rings on the external surface of the lense where the light scattering effect of the rings and serations is maximized.

While certain preferred embodiments of the invention have been specifically disclosed, it is understood that the invention is not limited thereto, as many variations will be readily apparent to those skilled in the art and the invention is to be given its broadest possible interpretation within the terms of the following claims.

We claim:

1. A circuit for an intrinsically safe pilot light comprising:
   a plurality of light emitting diodes connected in series,
   a pair of terminals connected to an intrinsically safe electric source,
   a full wave bridge rectifier connected in a circuit between the terminals and the series connected diodes for supplying the diodes with controlled polarity direct current regardless of the polarity of the source,
   and a current regulator connected in the circuit for maintaining constant the current supplied to the diodes upon failure of any of the diodes and to maintain the current at a value to optimize brightness of the diodes.

2. The circuit as set forth in claim 1 wherein the diodes are mounted on a board having a printed circuit that connects the diodes inseries and provides a reflecting surface for the light emitted by the diodes.

3. The circuit as recited in claim 2 including a second printed board and wherein the full wave bridge rectifier and the current regulator have components connected by a printed circuit on the second board.

4. The circuit as recited in claim 3 wherein the first mentioned printed circuit board and the second printed circuit board are physically maintained in spaced relation by a plurality of conductive support that provide an electrical connection between the circuits on said boards.

5. The circuit as recited in claim 4 wherein one of the conductive supports is a fuse.

6. The circuit as set forth in claim 5 wherein the diodes are mounted on a board having a printed circuit that connects the diodes in series and provides a reflecting surface for the light emitted by the diodes.

7. The circuit as recited in claim 6 including a second printed board and wherein the full wave bridge rectifier and the current regulator have components connected by a printed circuit on the second board.

8. The circuit as recited in claim 6 wherein the first mentioned printed circuit board and the second printed circuit board are physically maintained in spaced relation by a plurality of conductive support that provide an electrical connection between the circuits on said boards.

9. The circuit as recited in claim 7 wherein one of the conductive supports is a fuse.

* * * * *